United States Patent
Zhang et al.

(10) Patent No.: US 11,047,902 B2
(45) Date of Patent: **\*Jun. 29, 2021**

(54) IDENTIFICATION CIRCUIT FOR CABLE TELEVISION PLUG-IN FIXED ATTENUATOR

(71) Applicant: Global Technology Inc., Ningbo (CN)

(72) Inventors: Li Zhang, Ningbo (CN); Mingjun Bao, Ningbo (CN); Renhao Tan, Ningbo (CN)

(73) Assignee: Global Technology Inc., Ningbo (CN)

( * ) Notice: Subject to any disclaimer, the term of this patent is extended or adjusted under 35 U.S.C. 154(b) by 64 days.

This patent is subject to a terminal disclaimer.

(21) Appl. No.: 16/293,062

(22) Filed: Mar. 5, 2019

(65) Prior Publication Data

US 2020/0003827 A1  Jan. 2, 2020

(30) Foreign Application Priority Data

Jun. 28, 2018 (CN) .......................... 201810684491.4

(51) Int. Cl.
  *G01R 31/28* (2006.01)
  *G01R 15/04* (2006.01)
(52) U.S. Cl.
  CPC ......... *G01R 31/2825* (2013.01); *G01R 15/04* (2013.01)
(58) Field of Classification Search
  CPC .... G01R 31/2825; G01R 15/04; G01R 27/28; G01R 15/06; G01R 15/16; G01R 19/2509; G01R 31/50; H04N 7/102
  See application file for complete search history.

(56) References Cited

U.S. PATENT DOCUMENTS

| | | | |
|---|---|---|---|
| 4,507,618 A | 3/1985 | Nelson | |
| 6,054,905 A * | 4/2000 | Gresko | H04N 7/102 333/100 |
| 2002/0190811 A1 | 12/2002 | Sperber | |
| 2006/0176044 A1* | 8/2006 | Binder | G01R 27/04 324/71.1 |
| 2010/0266000 A1* | 10/2010 | Froimovich | H04N 21/6168 375/222 |
| 2016/0028490 A1 | 1/2016 | Wang | |

OTHER PUBLICATIONS

U.S. Office Action dated Oct. 6, 2020, received in U.S. Appl. No. 16/238,249, 11 pgs.

\* cited by examiner

*Primary Examiner* — Akm Zakaria
(74) *Attorney, Agent, or Firm* — Grossman Tucker Perreault & Pfleger, PLLC

(57) ABSTRACT

An identification circuit for a CATV plug-in fixed attenuator is disclosed. The disclosed identification circuit may include an attenuator, a power supply module to supply power, a detection module to detect an output divided voltage value, and a microcontroller unit (MCU) identification module to determine an attenuation value of the CATV plug-in fixed attenuator based on the detected divided voltage value. The power supply module is connected to an input terminal of the plug-in fixed attenuator. The detection module is connected to an output terminal of the plug-in fixed attenuator and to the MCU identification module. With the disclosed embodiments, attenuation parameters can be determined remotely and failures on the line can be located.

4 Claims, 4 Drawing Sheets

| ATTENUATION | R1 VALUE OF T-TYPE PAD | R2 VALUE OF T-TYPE PAD |
|---|---|---|
| 0dB | / | / |
| 1dB | 4.308 | 650.739 |
| 2dB | 8.587 | 323.230 |
| 3dB | 12.811 | 213.138 |
| 4dB | 16.952 | 157.432 |
| 5dB | 20.987 | 123.515 |
| 6dB | 24.895 | 100.527 |
| 7dB | 28.656 | 83.817 |
| 8dB | 32.256 | 71.064 |
| 9dB | 35.683 | 60.979 |
| 10dB | 38.927 | 52.788 |
| 11dB | 41.983 | 46.000 |
| 12dB | 44.849 | 40.287 |
| 13dB | 47.524 | 35.418 |
| 14dB | 50.012 | 31.231 |
| 15dB | 52.316 | 27.602 |
| 16dB | 54.442 | 24.439 |
| 17dB | 56.399 | 21.669 |
| 18dB | 58.193 | 19.234 |
| 19dB | 59.834 | 17.088 |
| 20dB | 61.332 | 15.192 |

FIG. 5

| ATTENUATION | R1 VALUE OF T-TYPE PAD | R2 VALUE OF T-TYPE PAD | DIVIDED VOLTAGE |
|---|---|---|---|
| 0dB | / | / | 3.3 |
| 1dB | 4.308 | 650.739 | 3.278 |
| 2dB | 8.587 | 323.230 | 3.215 |
| 3dB | 12.811 | 213.138 | 3.113 |
| 4dB | 16.952 | 157.432 | 2.979 |
| 5dB | 20.987 | 123.515 | 2.821 |
| 6dB | 24.895 | 100.527 | 2.645 |
| 7dB | 28.656 | 83.817 | 2.459 |
| 8dB | 32.256 | 71.064 | 2.270 |
| 9dB | 35.683 | 60.979 | 2.082 |
| 10dB | 38.927 | 52.788 | 1.899 |
| 11dB | 41.983 | 46.000 | 1.725 |
| 12dB | 44.849 | 40.287 | 1.562 |
| 13dB | 47.524 | 35.418 | 1.409 |
| 14dB | 50.012 | 31.231 | 1.269 |
| 15dB | 52.316 | 27.602 | 1.140 |
| 16dB | 54.442 | 24.439 | 1.022 |
| 17dB | 56.399 | 21.669 | 0.916 |
| 18dB | 58.193 | 19.234 | 0.820 |
| 19dB | 59.834 | 17.088 | 0.733 |
| 20dB | 61.332 | 15.192 | 0.655 |

FIG. 6

IDENTIFICATION CIRCUIT FOR CABLE TELEVISION PLUG-IN FIXED ATTENUATOR

TECHNICAL FIELD

The present disclosure relates to CATV plug-in fixed attenuators, and more particularly to an identification circuit for the CATV plug-in fixed attenuators.

BACKGROUND

Cable television (CATV) plug-in fixed attenuators are widely used in CATV products, and attenuation values generally used might start from 0 db to 20 db. Plug-in fixed attenuators can be applied in the input stage, the intermediate stage, and the output stage of both uplink and downlink to adjust the signal input level of the preceding stage, the signal matching of the current stage and the signal output level of the subsequent stage. In addition, CATV plug-in fixed attenuators are also used in other applications such as equalization circuits.

Due to the physical characteristics of the CATV plug-in fixed attenuator, if the equipment on the line network fails and the CATV plug-in fixed attenuator is damaged, or not properly or incorrectly placed, the network engineer would have go to the site to check the equipment manually, which is inefficient and costs more with more human resource to be utilized.

SUMMARY

One objective of the present disclosure is to provide an identification circuit for identifying a CATV plug-in fixed attenuator. With the disclosed identification circuit, evaluation of cable network operation can be performed remotely and a failure can be located and analyzed when it happens.

An identification circuit for the CATV plug-in fixed attenuator according to the present disclosure embodiment may include a power supply module to supply power, a detection module to detect an output divided voltage value, and a microcontroller unit (MCU) identification module to determine an attenuation value of the plug-in fixed attenuator based on the detected divided voltage value. The power supply module is connected to an input terminal of the plug-in fixed attenuator. The detection module is connected to an output terminal of the plug-in fixed attenuator and to the MCU identification module.

In some embodiments, the identification circuit may further include a voltage divider module connected to a ground terminal of the plug-in fixed attenuator for voltage dividing purpose.

In some embodiments, the power supply module may include a DC power supply, a first DC blocking capacitor, and a first inductor. The DC power supply is connected in series with the first inductor and then connected to an input terminal of the plug-in fixed attenuator. One terminal of the first DC blocking capacitor is connected to an input terminal of the first inductor, and the other terminal of the first DC blocking capacitor is grounded.

In some embodiments, the detection module includes a second DC blocking capacitor and a second inductor. The second inductor is connected between the output terminal of the plug-in fixed attenuator and a signal output terminal of the detection module. One terminal of the second DC blocking capacitor is connected to the signal output terminal of the detection module, and the other terminal of the second DC blocking capacitor is grounded.

In some embodiments, the voltage divider module includes a third DC blocking capacitor, a voltage dividing resistor and a third inductor. The third DC blocking capacitor is connected between a ground terminal of the plug-in fixed attenuator and ground. One terminal of the third inductor is connected to the ground terminal of the plug-in fixed attenuator, and the other terminal of the third inductor is connected in series with the voltage dividing resistor and grounded.

Since the detection module of the identification circuit of the present disclosure detects the output divided voltage value, and the MCU identification module identifies an attenuation value of plug-in fixed attenuator according to the detected divided voltage value, the identification circuit can be used to identify the CATV plug-in fixed attenuator and estimate whether the corresponding operation is correctly performed. The identification circuit can also locate and analyze a failure when it occurs.

BRIEF DESCRIPTION OF THE DRAWINGS

FIG. 5 is a table of resistance values for a 0-20 dB CATV plug-in fixed attenuator.

FIG. 6 is a table of voltage values for a corresponding detection module when r=0.

DETAILED DESCRIPTION

Embodiments of the present disclosure have been described with reference to the accompanying drawings. The disclosure can be embodied in various forms and should not be construed as limited to the embodiments set forth herein. The embodiments are intended for a thorough and complete understanding of the inventive concept. Throughout the description, like numbers refer to like elements.

The terminology used herein is for the purpose of describing particular example embodiments only and is not intended to be limiting. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Figure 1:
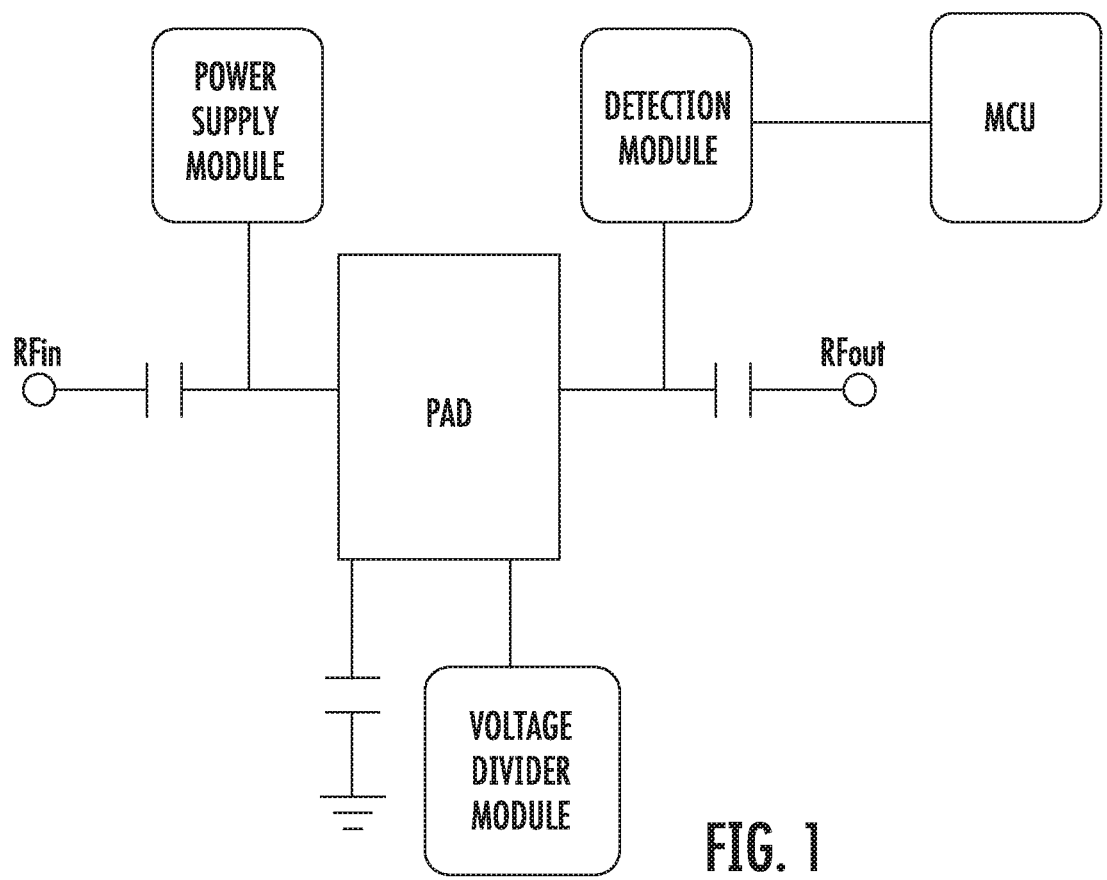
FIG. 1 is a block diagram of an identification circuit for a CATV plug-in fixed attenuator according to an embodiment of the present disclosure.
Figure 2:
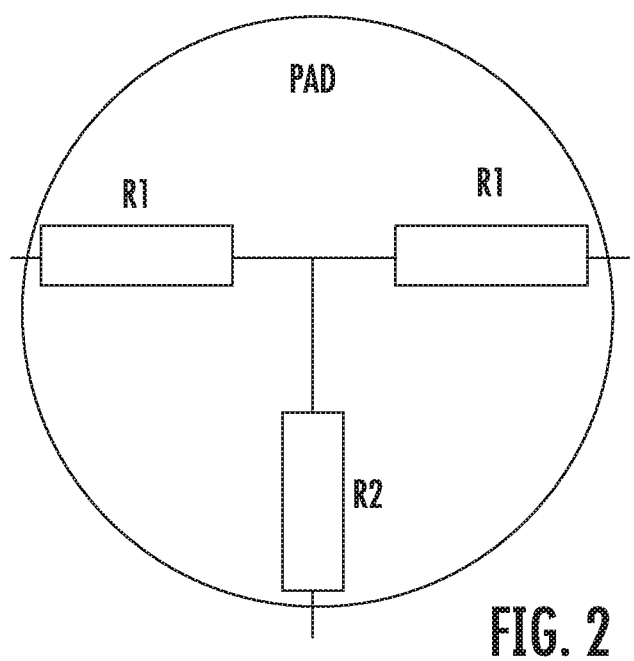
FIG. 2 is a structural schematic of a T-type attenuator of an identification circuit for a CATV plug-in fixed attenuator according to an embodiment of the present disclosure.

FIG. 1 illustrates a block diagram of an identification circuit for a CATV plug-in fixed attenuator according to one embodiment of the present disclosure. FIG. 2 illustrates a structural schematic of a T-type attenuator of an identification circuit for a CATV plug-in fixed attenuator according to one embodiment of the present disclosure.

Figure 3:
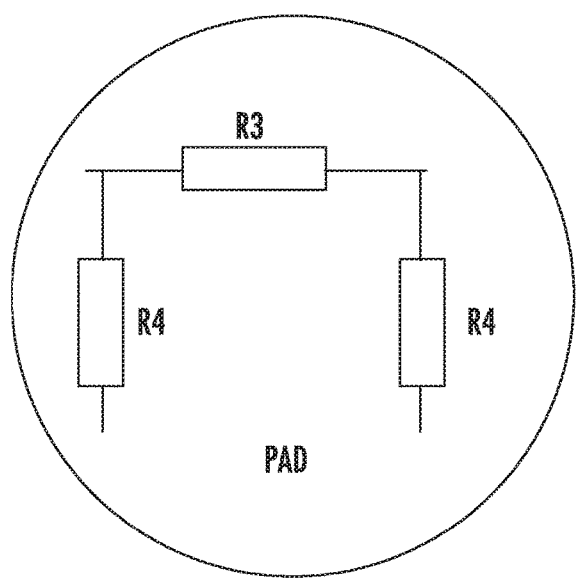
FIG. 3 is a structural schematic of a n-type attenuator of an identification circuit for a CATV plug-in fixed attenuator according to an embodiment of the present disclosure.

FIG. 3 illustrates a structural schematic of a n-type attenuator of an identification circuit for a CATV plug-in fixed attenuator according to one embodiment of the present disclosure. The identification circuit for the CATV plug-in fixed attenuator of the present disclosure may include a power supply module, a detection module, a MCU identification module and a voltage divider module. The plug-in fixed attenuator may include a T-type attenuator and a n-type attenuator. The T-type attenuator may include two resistors R1 and one resistor R2. Various attenuation values can be achieved by using different values of R1 and R2. The n-type attenuator may include one resistor R3 and two resistors R4. Various attenuation values can be similarly achieved by using different values of R3 and R4. The power supply module powers the identification circuit. The detection module is used to detect an output divided voltage value. The MCU identification module is used to determine an attenuation value of the plug-in fixed attenuator based on the detected divided voltage value. The voltage divider module is used for voltage dividing purposes. The power supply module is connected to an input terminal of the plug-in fixed attenuator. The detection module is connected to an output terminal of the plug-in fixed attenuator and to the MCU identification module. The detection module is to detect the divided voltage value. The MCU identification module is to determine an attenuation value of the plug-in fixed attenuator based on the detected divided voltage value.

The power supply module is connected to an input terminal of the plug-in fixed attenuator. The detecting module is connected to an output terminal of the plug-in fixed attenuator. The detecting module and the MCU identification module are connected to each other. The voltage divider module is connected to a ground terminal of the plug-in fixed attenuator.

Figure 4:
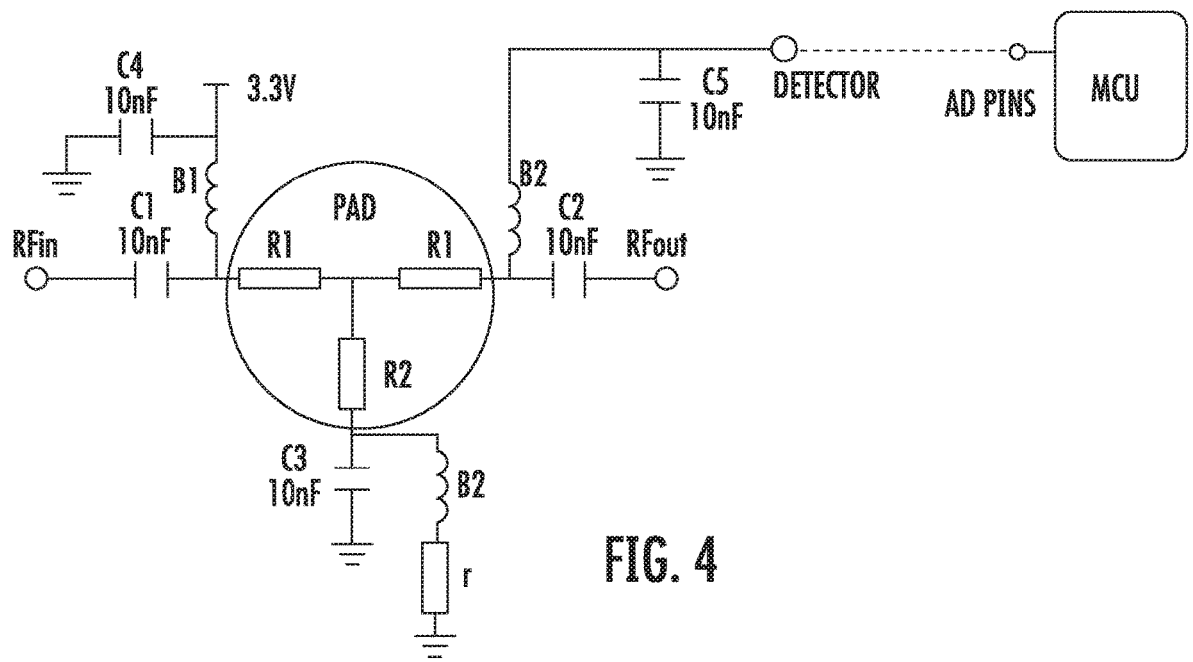
FIG. 4 is a circuit diagram of a CATV plug-in fixed attenuator according to an embodiment of the present disclosure.

FIG. 4 illustrates a circuit diagram of a CATV plug-in fixed attenuator according to one embodiment of the present disclosure. The power supply module may include a DC power supply, a first DC blocking capacitor, and a first inductor. The DC power supply is connected in series with the first inductor and then connected to an input terminal of the plug-in fixed attenuator. One terminal of the first DC blocking capacitor is connected to an input terminal of the first inductor, and the other terminal of the first DC blocking capacitor is grounded. The detection module includes a second DC blocking capacitor and a second inductor. The second inductor is connected between an output terminal of the plug-in fixed attenuator and a signal output terminal of the detection module. One terminal of the second DC blocking capacitor is connected to the signal output terminal of the detection module, and the other terminal of the second DC blocking capacitor is grounded. The voltage divider module may include a third DC blocking capacitor, a voltage dividing resistor and a third inductor. The third DC blocking capacitor is connected between a ground terminal of the plug-in fixed attenuator and ground. One terminal of the third inductor is connected to the ground terminal of the plug-in fixed attenuator, and the other terminal of the third inductor is connected in series with the voltage dividing resistor and grounded.

In the circuit diagram, C1, C2, and C3 are the DC blocking capacitors to block the DC voltage from reaching the RF circuits. B1, B2, and B3 are high-frequency magnetic beads to isolate the RF signals. As shown in FIG. 3, a DC voltage of, for example, 3.3 VDC is input from a right side of C1, and then a branch consisted of R1, R2, B2 and r will form a conducting path. Since the impedance of the magnetic bead is nearly zero at low frequencies, a voltage detected by the detection module would be a sum of the divided voltages on R2 and r: $3.3V/(R1+R2+r)*(R2+r)$. The pins of the detection module will be connected to the AD pins of the MCU identification module to perform the identification. Since the resistance values R1 and R2 of the resistors are different for different CATV plug-in fixed attenuators, the voltage values detected by the detection module would also vary.

FIG. 5 is a table of resistance values for a 0-20 dB CATV plug-in fixed attenuator.

FIG. 6 is a table of voltage values for a corresponding detection module when r=0. The table of voltage values can be written into the MCU identification module. When switching between different CATV plug-in fixed attenuators, the detection module will generate different voltages accordingly and output the voltages to the AD pins of the MCU identification module. By looking up the table, the MCU identification module will derive an attenuation value corresponding to any voltage values in the table for the CATV plug-in fixed attenuator. If no attenuator has been inserted, the detection module will experience an open circuit and the detected voltage on the AD pins of the MCU identification module is 0V. A determination as to whether the CATV plug-in attenuator has been properly configured on the line can be made using this approach.

The foregoing description of the embodiments has been provided for purposes of illustration and description. It is not intended to be exhaustive or to limit the disclosure. Variations or modifications of the embodiments are not to be regarded as a departure from the disclosure, and all such modifications are intended to be included within the scope of the disclosure.

What is claimed is:

1. An identification circuit for a cable television (CATV) plug-in fixed attenuator, comprising:
   a power supply module to supply power;
   a detection module to detect an output divided voltage value; and
   a microcontroller unit (MCU) identification module to determine an attenuation value of the CATV plug-in fixed attenuator based on the detected divided voltage value; wherein
   the power supply module is connected to an input terminal of the CATV plug-in fixed attenuator;
   the detection module is connected to an output terminal of the CATV plug-in fixed attenuator and to the MCU identification module; and
   wherein the power supply module comprises a DC power supply, a first DC blocking capacitor, and a first inductor; the DC power supply is connected in series with the first inductor and then connected to an input terminal of the CATV plug-in fixed attenuator, one terminal of the first DC blocking capacitor is connected to an input terminal of the first inductor; and the other terminal of the first DC blocking capacitor is grounded.

2. The identification circuit of claim 1, further comprising a voltage divider module connected to a ground terminal of the CATV plug-in fixed attenuator functioning as a resistance for voltage dividing.

3. The identification circuit of claim 1, wherein the detection module includes a second DC blocking capacitor and a second inductor; the second inductor is connected between the output terminal of the CATV plug-in fixed attenuator and a signal output terminal of the detection module; one terminal of the second DC blocking capacitor is connected to the signal output terminal of the detection module, and the other terminal of the second DC blocking capacitor is grounded.

4. The identification circuit of claim 2, wherein the voltage divider module includes a third DC blocking capacitor, a voltage dividing resistor and a third inductor; the third DC blocking capacitor is connected between a ground terminal of the CATV plug-in fixed attenuator and ground; one terminal of the third inductor is connected to the ground terminal of the CATV plug-in fixed attenuator; and the other terminal of the third inductor is connected in series with the voltage dividing resistor and grounded.

\* \* \* \* \*